United States Patent [19]

Chance et al.

[11] 4,430,690

[45] Feb. 7, 1984

[54] LOW INDUCTANCE MLC CAPACITOR WITH METAL IMPREGNATION AND SOLDER BAR CONTACT

[75] Inventors: Dudley A. Chance, Danbury, Conn.; Chung W. Ho, Chappaqua, N.Y.; Timothy C. Reiley, Ridgefield, Conn.

[73] Assignee: International Business Machines Corporation, Armonk, N.Y.

[21] Appl. No.: 433,329

[22] Filed: Oct. 7, 1982

[51] Int. Cl.³ .................. H01G 1/01; H01G 3/06

[52] U.S. Cl. .................. 361/321; 29/25.42

[58] Field of Search .................. 29/25.42; 361/306, 308, 361/309, 311, 313, 320, 321

[56] References Cited

U.S. PATENT DOCUMENTS

| | | | |
|---|---|---|---|
| 3,235,939 | 2/1966 | Rodriguez et al. | 29/25.42 |
| 3,679,950 | 7/1972 | Rutt | 361/321 |
| 3,784,887 | 1/1974 | Sheard | 29/25.42 X |
| 3,852,877 | 12/1974 | Ahn et al. | 29/25.42 X |
| 3,879,645 | 4/1975 | Rutt et al. | 361/321 |
| 3,965,552 | 6/1976 | Rutt | 29/25.42 |
| 4,030,004 | 6/1977 | Rutt | 361/313 |
| 4,189,760 | 2/1980 | Marshall | 361/321 |
| 4,246,625 | 1/1981 | Prakash | 361/321 |
| 4,297,773 | 11/1981 | Galvagni | 29/25.42 |

*Primary Examiner*—Donald A. Griffin
*Attorney, Agent, or Firm*—Graham S. Jones, II

[57] ABSTRACT

A laminated capacitor is joined to the surface of a chip carrier for large scale integrated circuit chips. The capacitor lies adjacent to positions where chips are located. The capacitor includes a plurality of capacitor plates. The capacitor is bonded to the chip carrier with an array of solder bars comprising an elongated strip of metallic material. Each of the bars is connected to a set of the capacitor plates in the laminated capacitor by means of tab connections on the plates, whereby each of the plates is connected by a plurality of tabs to a plurality of the solder bars. Methods of fabrication of the laminated capacitor structure and solder bars are described.

18 Claims, 16 Drawing Figures

FIG. 2.1
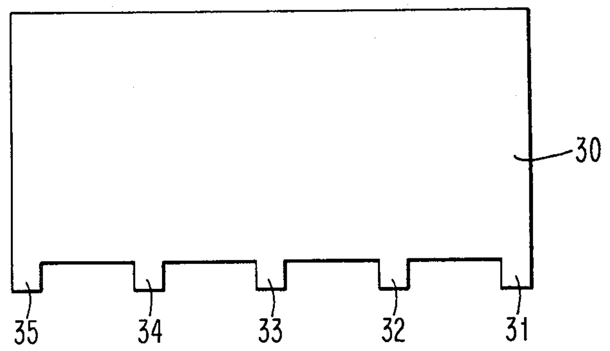
FIG. 2.2
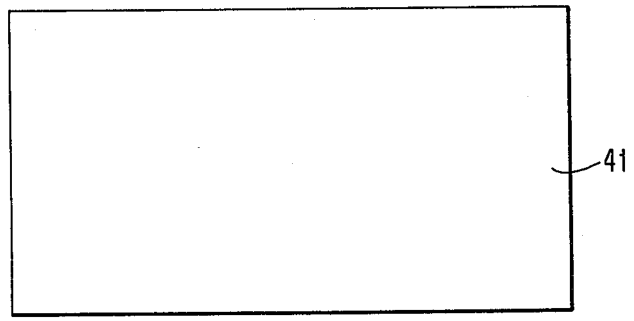
FIG. 2.3
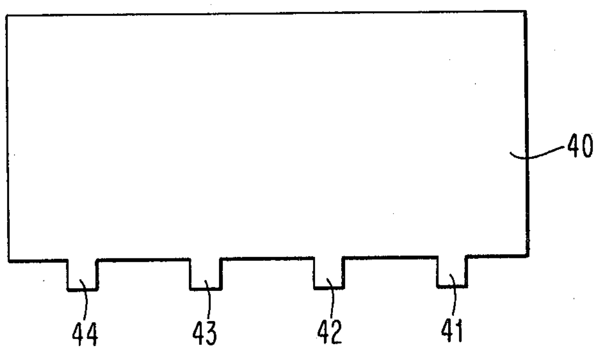

FIG. 6.1
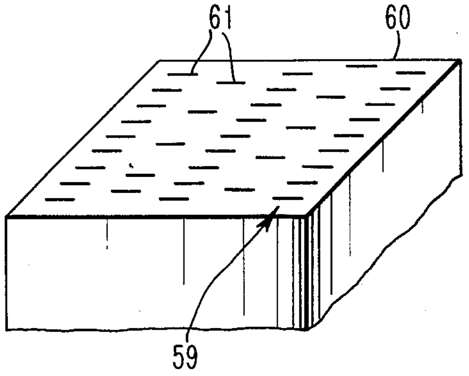
FIG. 6.2
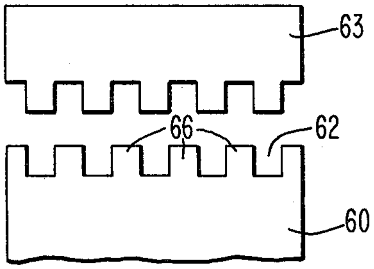
FIG. 6.3
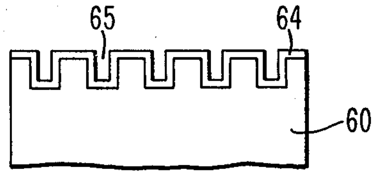
FIG. 6.4
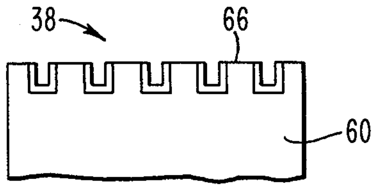
FIG. 6.5
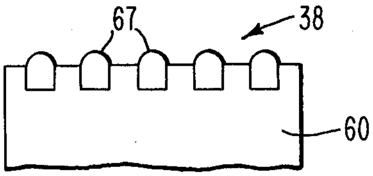

FIG. 7.1
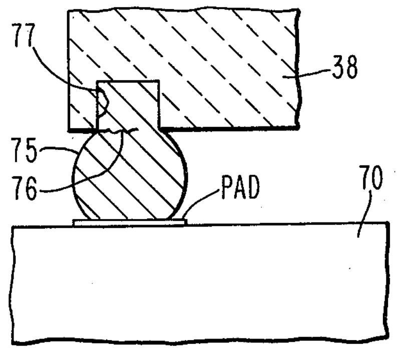
FIG. 7.2
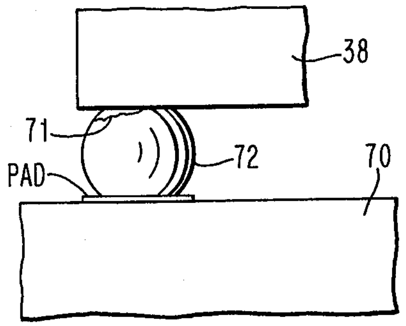
FIG. 8
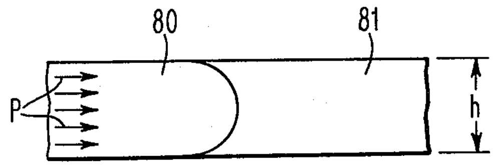

LOW INDUCTANCE MLC CAPACITOR WITH METAL IMPREGNATION AND SOLDER BAR CONTACT

TECHNICAL FIELD

This invention relates to ceramic capacitors for LSI chip packaging modules and more particularly to terminals for such capacitors.

BACKGROUND ART

Bajorek et al U.S. Pat. No. 4,349,862 shows a laminated capacitor bonded to a chip carrier by means of solder balls connected to individual capacitor plates. U.S. Pat. No. 4,246,625 of Prakash shows a laminated capacitor with terminals on the ends bonded to the plates of the capacitor.

U.S. Pat. No. 4,189,760 of Marshall for "Monolithic Capacitor with Non-noble Metal Electrodes and Method of Making the Same" describes a method of making a multilayered monolithic capacitor by using an electrode forming material including nickel oxide powder which is included in the laminated structure when it is fired. After firing, the nickel is removed by dissolving the nickel in a solution such as dilute sulfuric acid. After refiring, the structure contains voids which can be filled with suitable electrode material applied by means of a combination of capillary action and pressure. Fusible metal such as solder can be used.

Commonly assigned U.S. Pat. No. 3,852,877 of Ahn et al for "Multilayer Circuits" describes a method of forming vias from a metallizing medium which includes "metals and compounds which convert to a metal during firing. The sheets are stacked in registry, laminated into a monolithic structure and heated in a reducing atmosphere to sinter the ceramic to a dense body, and simultaneously fire the metallizing media to form an adherent metal capillary within the body. A high conductivity, low melting point conductor fills the capillary thereby forming a highly conductive circuit member in the multilevel ceramic structure.

The metallizing media can be in the form of a paste. U.S. Pat. No. 3,235,939 of Rodriguez et al "Process for Manufacturing Multilayer Ceramic Capacitors" shows formation of laminated capacitors and then applying metallization to the edge of the laminated structure to give parallel connections of each end of the stack so that the plates can be bussed together. The laminated capacitor is then attached to a set of leads with one at each end of the stack. U.S. Pat. Nos. 4,030,004, 3,829,356, 3,772,748, 3,965,552 and 3,679,950 of Rutt for ceramic capacitors and the like disclose methods for manufacturing MLC circuits and capacitors. Use is made of a paste that defines the circuit patterns within the structure. The paste volatizes during firing leaving voids within the structure. These voids are then filled with molten metal to form conductors within the substrate.

In the case of each of the capacitors discussed above, each of the capacitors is terminated on each end with a single lead. The only exception to that arrangement is the above patent of Bajorek et al wherein the capacitor tabs are connected to the buss bars which are connected to the LSI chip carrier by means of multiple C-4 balls, in a manner which is substantially enhanced by the instant invention, which eliminates the solder balls and substitutes the solder bars of this invention therefor. D. A. Chance and D. L. Wilcox "Capillary-Infiltrated Conductors in Ceramics" Metallurgical Transactions Vol. 2, 733–740 (Mar. 1971) describe infiltration of high conductivity liquid metals into partially metallized capillaries in ceramic structures to form highly conductive lines in the structure. Here oxidation of the previously applied metal must be avoided by operating in the absence of oxygen, etc.

In summary heretofore, a number of multiple layered ceramic technology developments have been made. MLC capacitors have been developed with edge connections, and with low inductance connections. MLC chip carriers have been provided with vias and lines which can be fabricated by a process of infiltration. In addition, in the art of capacitors, fabrication has been achieved by impregnation of ceramic structures with liquid metal. The improvements of this invention over the prior art are to afford a low inductance bar contact arrangement, fabrication of capacitor plates and connections by means of impregnation, and simplified processing procedures for achieving those ends.

SUMMARY OF THE INVENTION

Problems of fabrication of a low inductance discrete capacitor need to be minimized in order to provide the structure required. An object of this invention is to provide a large scale integrated packaging circuit component by employing a structure and processes for fabricating a metal impregnated discrete capacitor with low inductance contacts. The fabrication of a laminated form of multilayered ceramic (MLC) metal and ceramic capacitor, is usually accomplished by the cofiring of metallic and ceramic materials. The problem is that ceramics are generally oxidized metallic elements and there is a compromise in the selection of the metal electrodes such that the metal neither oxidizes in the firing ambient, nor does it melt at the firing temperature, yet enters compatibly with the ceramic. Specifically, a high dielectric constant material which is usually composed of a titanate compound, requires fabrication in an environment which is nonreducing at temperatures exceeding 1000° C. This normally limits the choice of metals which can be used in the cofired metal to the noble metals such as an Ag—Pd alloy.

Provisions for a low inductance power supply system such as that necessary for high current and fast switching circuits require low inductance current paths both within the capacitor and interconnections from the capacitor to the integrated circuit chips. This invention provides such low inductance current paths which reduce inductance by affording current flow in opposing directions in multiple adjacent current paths. The inductance is reduced one to two orders of magnitude below a comparable and typical MLC capacitor with two terminals at opposing ends of the capacitor.

In some designs for chip carrying packages, multiple contact solder ball joints are employed for the purpose of making connections. A problem with that form of contact arrangement is that the technologies involved in using photolithographic masking techniques are not readily applicable to ceramic capacitors. That difficulty of application derives from the lamination and firing steps which produce products having dimensional characteristics with wide tolerances. The tolerances are caused by a process whose results are somewhat unpredictable. That is, firing leads to variable ceramic materials, densification and shrinkage which are intrinsic in the manufacturing process. Manifestly, it is necessary to employ non-trivial processing steps for construction of contact metallurgy solder dams and solder balls.

In the manufacture of MLC structures such as chip carrier substrates or capacitors, metallic pastes containing Mo, Cu, Pd, Ag, etc. are screened onto green ceramic sheets in accordance with the current state of the art. These sheets are then stacked, laminated and fired. The metallic pastes sinter to become a three-dimensional conductive network of individual conductive segments and lines insulated from each other by the surrounding dielectric material. One difficulty with the firing step is that it requires cofiring all materials within the MLC structure in an atmosphere which reduces the metal but oxidizes the ceramic sufficiently to maintain the desired electrical resistance and dielectric constant. See commonly assigned U.S. Pat. No. 4,234,367 of Herron et al for "Method of Making Multilayered Glass-Ceramic Structures Having an Internal Distribution of Copper-Based Conductors" for further elucidation at this point. Another difficulty is the difference between the sintering temperatures of the metal pastes and the dielectric materials. After only one material sinters, the subsequent shrinkage associated with the sintering of a second material leads to stress generation and later to distortion upon cooling. Via bulging is an example of such distortion. Furthermore, upon cooling, the expansion between MLC materials can generate additional stresses. For example, this can place limitations on via spacing, since too closely spaced vias can cause thermal expansion to induce cracking of the structure. All of these problems can be ameliorated (reduced or eliminated) by a post-firing metallization step employing impregnation of liquid metal into the structure to provide the desired conductor structure.

In accordance with this invention, in a chip carrier for large scale integrated circuit chips, with a laminated capacitor joined to the surface of the carrier adjacent to positions where chips are located, the laminated capacitor including a plurality of capacitor plates, the improvement comprising bonding the capacitor to the chip carrier with an array of solder bars comprising an elongated strip of metallic material each of the bars connected to a set of the capacitor plates in the laminated capacitor by means of tab connections on the plates, whereby each of the plates is connected by a plurality of tabs to a plurality of the solder bars.

Preferably, the plates and the tabs have been formed by means of introducing (forcing) metal into the laminated structure and the solder bars have a rounded contour on the surface extending away from the chip. The substrate includes a set of elongated pads bonded along their length to the solder bars. The solder bars are formed by embossing of grooves into green ceramic material. At least one of the solder bars is formed in a recess in the laminated capacitor whereby a strong mechanical arrangement is provided. In another aspect of this invention, a method is provided for forming a laminated capacitor comprising (a) punching individual layers of green ceramic material having metallic material for forming tabs and/or capacitor plates screened thereon in selected areas of the layers in a predetermined pattern, (b) stacking the layers of green ceramic material upon one another to form a stack and sintering the green stack, and (c) forming bars on the edge of the stack. The method of forming bars on the edge of the stack by means of the steps including (a) coating the edge of the sheets with a metal film, with openings being left in the metal film for introduction of liquid metal into openings appropriate for formation of said tabs and/or capacitor plates, (b) defining bar patterns on the capacitor by cutting portions of the metal film to form bar portions on the edge coated with the metal film, or forming embossed patterns on the surface prior to firing in step (b, c) impregnation of molten metal into the tab openings to form tabs and capacitor plates also at will in accordance with predetermined design parameters. In accordance with this invention wherein the bars are formed on the edge of the stack by applying a mask to the edge of the stack and applying metal to the edge through slots in the mask forming bar patterns. Preferably, the bars are formed by evaporating metal into the slots. The metal comprises adhesion metal, solder wettable metal and solder evaporated in sequence into the slots. Preferably, the tabs and/or plates in the stack and the bars are formed by heating the product of one of the above methods in an evacuated chamber to the melting point of the solder, back filling the chamber with an inert gas forcing solder into the tabs and/or plates in the stack providing impregnation of metal solder in the liquid state from the slots in the mask onto the edge of the stack and into the tabs and/or plates.

Preferably, the solder bar includes enough solder to join the bar to a mounting pad subsequent to the impregnation step. In another aspect of this invention, a method is provided for forming a capacitor from a laminated stack of ceramic sheets comprising (a) forming a stack of ceramic green sheets with patterns of (1) metallization or (2) alternatively a screened layer of paste primarily containing combustible volatile elements formed on the surface of the sheets, (b) embossing the stack of green sheets with an array of grooves on the edge of the stack, (c) firing the stack to produce a partially completed capacitor, (d) coating the embossed edge of the stack with a metal film (e) machining the edge of the stack to remove the distal portions of the film projecting from the grooves to separate the metal film into segments contained solely within the depressions of the grooves, (f) if the electrode cavities are unfilled because combustible volatile paste was used in step a (2), then a step follows of impregnation of the metal coated grooves with molten solder wettable metal, and (g) evaporation of solder onto the solder wettable metal.

Preferably, the product of one of the above processes is reflowed to form rounded contours on the solder bars. It is inverted and joined to a metallized substrate. Preferably, the slots and the capacitor plates are prepared for filling and the metallization material comprises · premetallization substitute comprising ceramic partic.es and an organic material, and after firing the structure as above, (a) the structure is placed in a vacuum processing chamber and the chamber is evacuated, (b) the structure is dipped into a liquid metal bath, (c) the chamber is pressurized to drive the liquid metal into the openings in the structure to fill the cavities within the structure to form capacitor plates, vias, and/or tabs.

Preferably, the solid metal is applied to the slots and upon heating and pressurization the metal melts and is forced into the cavities which remain thereby forming metallization in the cavities.

BRIEF DESCRIPTION OF THE DRAWINGS

FIG. 2.1 shows one of the electrically conductive plates of a laminated capacitor of FIG. 1 in accordance with this invention.

FIG. 2.2 shows a dielectric layer for the laminated capacitor chip of FIG. 1.

FIG. 2.3 shows a second capacitor plate in accordance with FIGS. 1 and 2.1 which complements the capacitor plate of FIG. 2.1.

FIGS. 6.1 to 6.5 illustrate a set of processing steps for making a capacitor chip in accordance with this invention.

FIG. 7.1 shows a capacitor chip in accordance with this invention supported on a substrate by means of a bar contact in accordance with this invention.

FIG. 7.2 shows a conventional solder ball joining a chip to a substrate in accordance with the prior art.

FIG. 8 shows a cavity for impregnation of liquid metal into tabs and plates in accordance with this invention.

DESCRIPTION OF THE PREFERRED EMBODIMENT

Figure 1:
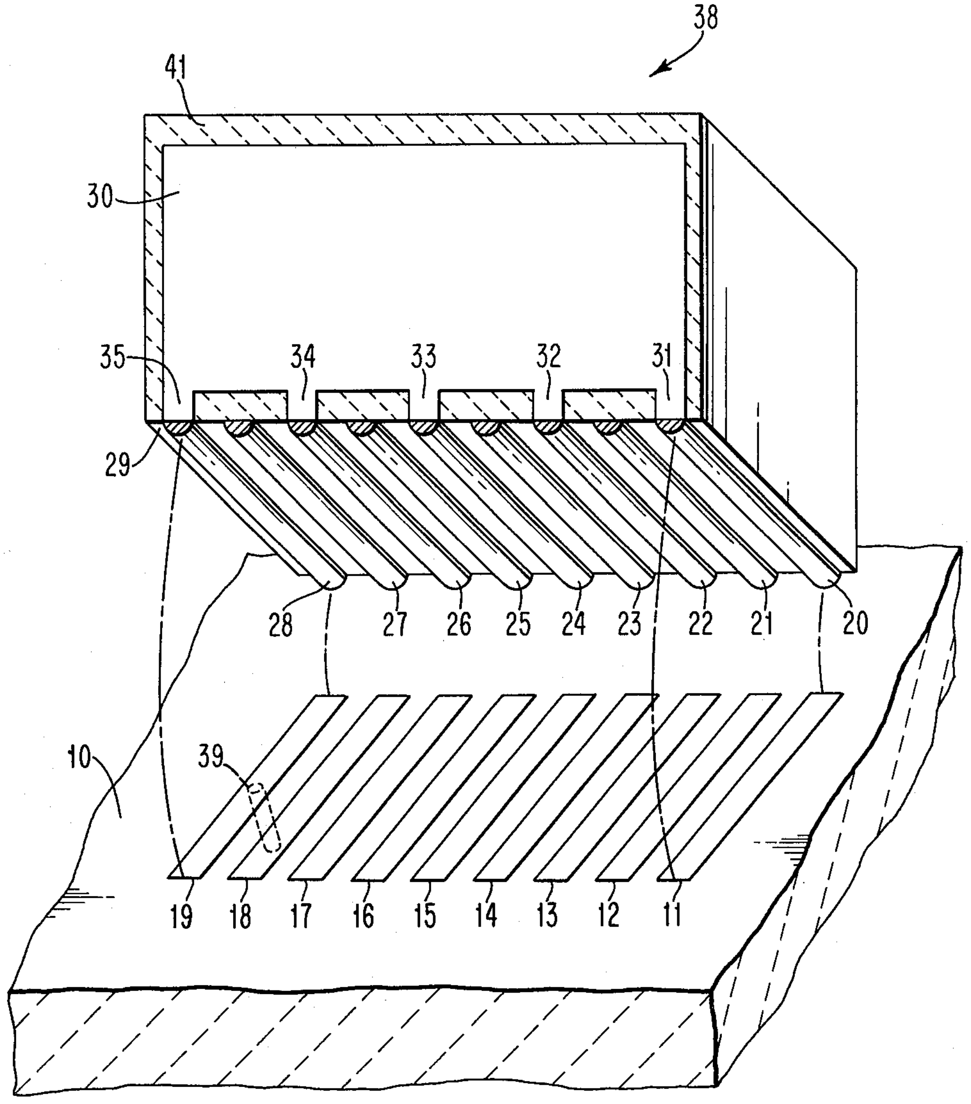
FIG. 1 shows a perspective view of a capacitor chip and a chip carrier below the chip with lands for accepting the solder bar connectors on the chip in accordance with this invention.

FIG. 1 shows a substrate 10 carrying an array of bar contacts 11 to 19 which are supported on the surface of substrate 10. Substrate 10 comprises a ceramic module incorporating conductive circuit lines and vias such as those shown in commonly assigned U.S. Pat. No. 4,349,862 for "Capacitive Chip Carrier and Multilayer Ceramic Capacitors" and U.S. Pat. No. 4,328,530 of Bajorek et al for "Multiple Layer, Ceramic Carrier for High Switching Speed VLSI Chips".

Above the substrate is shown a discrete capacitor chip 38 which is designed to have a minimum inductance in accordance with this invention. Capacitor 38 comprises a laminated stack of vertical conductor planes or capacitor plates such as plate 30 separated by means of dielectric layers 41 which extend beyond the edges of the plates 30, etc. On the other edge of plate 30 are shown tabs 31 to 35 which are provided for the purpose of connecting electrically to the negative (reference voltage) transverse solder bars 20, 22, 24, 26 and 28 with the positive solder bars 21, 23, 25 and 27 insulated from the plate 30 but connected to the positive plates beneath plate 30 in the laminated structure of capacitor 38.

The advantage of the structure shown is that the capacitor plates have many electrical connection sites, i.e. the tabs 31-35 of plate 30 and plates below plate 30 which are interconnected to share a common voltage.

It should be understood that there can be several sets of plates operating at several different voltages with respect to the reference voltage. In this embodiment, only two sets of plates are shown for convenience (i.e., simplicity) of illustration. There are similar tabs on the plates having differing voltages as well, which tabs connect to the distributed solder bars 20-28 to provide short electrical paths from a capacitor plate 30, etc. to a connection to a bar contact 11 to 19 from a via reaching up to contact it from below the surface of the substrate 10 where power distribution planes are buried in accordance with VLSI packaging systems. The advantages of this arrangement is that the short paths from vias such as via 39 to capacitor plates such as plate 30 and its parallel reference plates provide a minimum value of inductance in the paths between the plates and the vias. The inductance is minimized because the current paths are distributed and adjacent paths carry currents in opposite directions so the inductance is cancelled out.

FIGS. 2.1-2.3 show the plate 30 with tabs 31-35 and plate 40 which is a plate having voltage VI, with tabs 41-44 which connect through the solder bars 20-28 to a source with the appropriate voltage. The plates 30 and 40 and their associated tabs are separated mechanically and are isolated electrically by means of the dielectric separator sheet 41.

The structure shown in FIGS. 1 and 2.1 to 2.3 uses the bar contact metallurgy (BCM) and may use the solder impregnation process, to simplify the process of fabrication considerably, when manufacturing a low inductance capacitor 38 as a component manufactured in accordance with this invention. In addition, the properties of the ambient atmosphere during firing may be optimized for high reliability and for the dielectric properties of the ceramic material. The soldered contacts of the capacitor 38 use the shorting bars 20 to 28 connecting across the common tabs of the low inductance discrete capacitors 30. The bars 20-28 on the capacitor are soldered and reflowed onto matching metal bars 11-19 on the substrate 10.

The advantages of fabricating the discrete capacitor with bar contacts and impregnated metal are based upon the simplified process obtained and the improved reliability. Now discussion of processes of fabrication of a capacitor structure 38 follows.

PROCESS I

Figure 3:
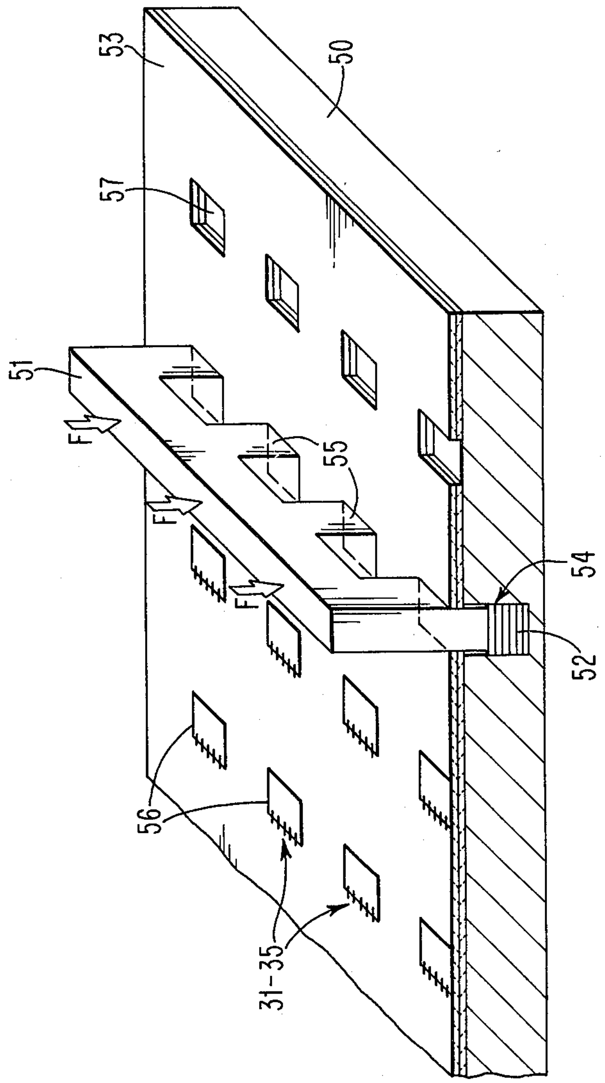
FIG. 3 is a perspective view of a punch and die operating upon a green sheet which has been printed with capacitor metallization in accordance with this invention. The tabs of the capacitor plate electrodes are shown at the end of the metallization.

A. The capacitors can be fabricated as discrete individual capacitors by punching individually screened layers as shown in FIG. 3. FIG. 3 shows a punch and lamination die 50 with a plurality of openings 54 for punched portions 52 of the green sheet 53 which are punched out by the punch tool 51 carrying punch elements 55. Portions are pushed down by force F into the openings 54 by the punch elements 55. Punched areas 57 remain where portions 52 have been punched and pushed down into openings 54. Prior to punching, the green sheet 53 is printed with metallized paste 56 or combustible paste (suitable for impregnation) with the tabs 31-35 (or 41-44 from FIGS. 2.1-2.3) shown on the left. This process is used by current capacitor manufacturers, but better control of sheet position prior to punching may be required.

Figure 4:
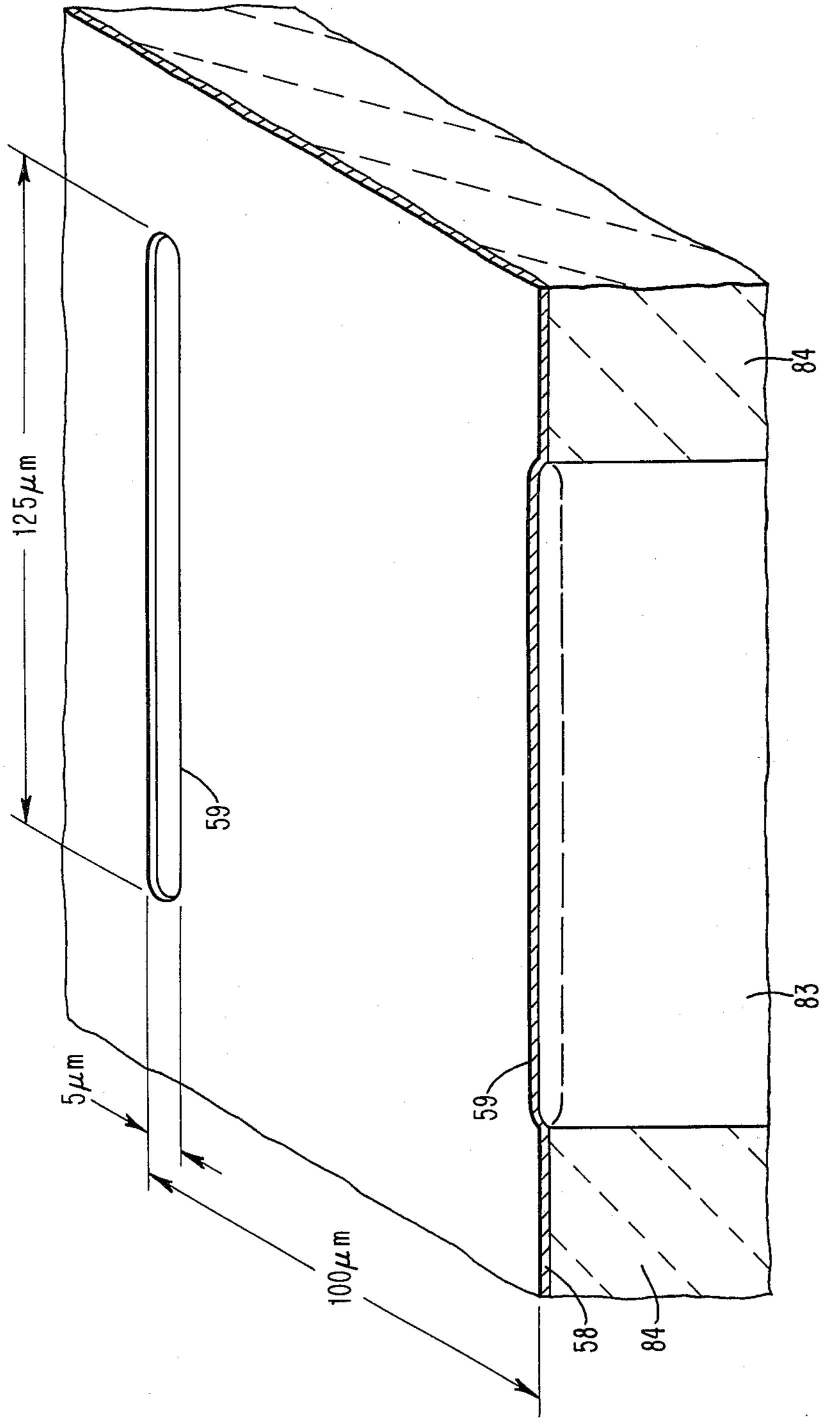
FIG. 4 shows the tab surface of a capacitor assembly prepared for impregnation with liquid metal the surface is coated with a thin film of blanket metallurgy. The tab openings provide an entry for forcing liquid metal into cavities to form the capacitor plates and the tabs on the plates of FIGS. 2.1 and 2.3.

Referring to FIG. 4, for the impregnated capacitor, the normally used metal paste is replaced by a paste containing particles (e.g., carbon or terephthalic acid) which volatilizes completely during burnoff, forming a planar cavity 83 between the dielectric layers 84. A coarse ceramic powder may be included in the paste, which after firing, leaves a porous cavity 83 with the particles separating the planes of dielectric 84.

B. After sintering the capacitors are stacked and then the edges are coated with a blanket of metallization on the surface with layers of an adherent metal (Cr, Ti, V. etc. about 100 nm thick) and a solder wettable metal (Cu, Ni, Au, etc. about 500 nm thick). The thickness of the metallic composite 58 is designed to allow long contact with molten solder without being depleted by alloying or dissolution but of insufficient thickness to clog the tab openings 59 of each porous cavity 83. The relative sizes are shown in FIG. 4.

C. To define the bar patterns on the capacitor a saw is used to remove portions of the blanket 58 of metallization and thus portions of the capacitor between the tab arrays 61. Alternatively, the structure can be embossed as described below in connection with FIGS. 6.1–6.5.

D. The impregnation of molten solder is accomplished by applying vaccuum, immersing the capacitors in molten solder, repressurizing the impregnate solder and withdrawing the capacitor from the solder. On cooling finished capacitors are obtained as shown in FIG. 1.

An alternate process for impregnation is by decal transfer of solder. Sufficient solder on a decal is transferred to the tabs by melting in a vacuum. On pressurizing while still molten, the solder is driven into the capacitor leaving excess solder on the tabs for joining as is shown in FIG. 7.

PROCESS II

Figure 5:
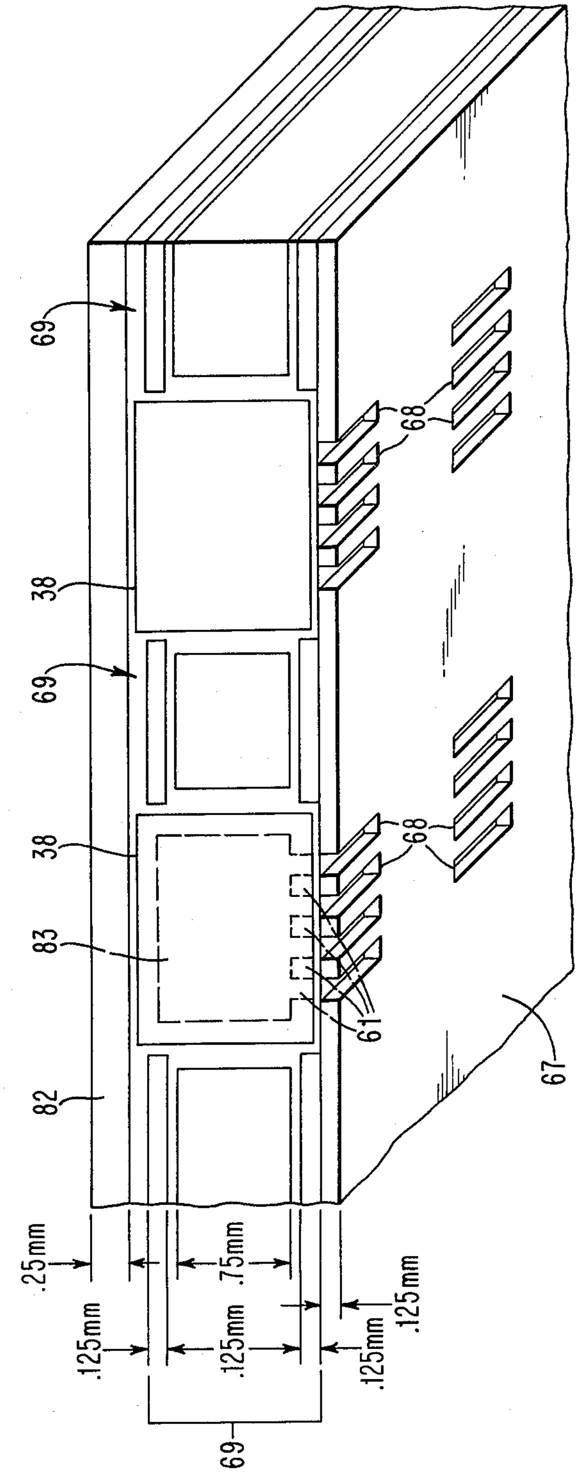
FIG. 5 is a perspective view showing a set of capacitor chips in accordance with this invention carried in a jig comprising a backing plate and a mask, and lateral-alignment slotted fixtures for holding the chips in place during surface metallization and solder evaporation.

FIG. 5 illustrates an alternate post-sintering process which uses more sophisticated alignment masks 67 and carrier jigs (comprising laminated and brazed alignment plates 69) to hold the capacitor chips 38 in place. Mask 67 is brazed to alignment plates 69. The mask 67 which serves as an evaporation mask and jigs 69 are shown in FIG. 5. The adhesion metal, solder wettable metal and solder are evaporated in sequence through slots 68 over the tabs. On heating above the melting point of the solder, back filling with an inert gas for impregnation of areas 83 with liquid metal solder and cooling down, the contact metallurgy process is completed. In this case saw cutting for bar definition is unnecessary.

It is possible that a double evaporation/impregnation process is necessary to fill the electrode cavities and to provide sufficient solder for the solder bar contacts. The sequence would be, evacuate, evaporate, heat and impregnate, cool, evacuate, evaporate, heat and impregnate and cool.

Appropriate tolerances for the capacitors are a about 0.025 mm perpendicular to the solder bars and 0.05 mm parallel to the solder bars. The bar location is about 0.125 mm from the edge of the capacitor chip.

IMPROVEMENT IN FATIGUE RESISTANCE

FIGS. 6.1–6.5 show a capacitor chip 60 containing electrodes (or planar cavities 83 as in FIG. 5 to be filled with metal). This simplifies the fabrication of the capacitor by incorporating bar contact (20–28 in FIG. 1) rather than C-4 solder ball joints as the connections between the capacitor electrodes and the substrates. The result of use of this procedure is that the joints produced have improved fatigue resistance.

STEP A

FIG. 6.1 shows a capacitor comprising a green stack 60 of laminated layers of ceramic and metal layers with the tabs 61 of the capacitor plates shown on the upper surface of the laminated structure. The tabs 61 are to be formed by means of providing them on the plates (30, 40 in FIGS. 2.1–2.3) or by means of providing planar cavities 83 and filling them with metal. The cavities are formed by the process described below in connection with FIG. 7.

STEP B

In FIG. 6.2, the green capacitor stack 60 is shown after it has been embossed with rows 62 extending back into the page by means of the embossing tool 63 having the required pattern of grooves, which is shown. The resulting structure is a set of parallel rows of grooves 62 on the upper surface of the capacitor 60 aligned with the rows 59 of tabs 61. The rows 59 are to be interconnected by means of the solder bar bus lines in accordance with this invention as described above. Whereas, FIG. 6.1 shows the stack of capacitor laminations after the laminating process has been completed, it is possible to combine the lamination process with the embossing of solder bar grooves in FIG. 6.2 into a unitary process with the upper surface (which would be lying on its side in the laminating press) of the laminations exposed to the grooved embossing tool during the laminating process.

STEP C

The capacitor stack 60 is fired to produce a partially completed capacitor chip 38.

STEP D

In FIG. 6.3, the embossed surface of the capacitor 60 is now coated with a blanket layer of metallic film 64 leaving rows of shallower and narrower grooves 65 overlying grooves 62 which are partially filled with metallic film 64 and coated with metallic film 64 on the walls of the grooves. Film 64 can be deposited by means of evaporation although for a capacitor containing electrodes, other techniques such as screening of metal through a silk screen may be appropriate to this process.

STEP E

In FIG. 6.4, the embossed surface of the capacitor chip 38 is lapped thereby removing the projecting surfaces of chip 38 revealing the surfaces 66 again between the grooves 65 (62). Surfaces 66 are bare ceramic lapped surfaces with some of the ceramic material removed. Surfaces 66 are exposed in order to separate the metallically coated grooves 65 electrically, since sections of the metallic film 64 are separated by the lapping procedure. The bare ceramic surfaces 66 are in the form of bar patterns located between the rows 65 covering the rows 59 of tabs 61.

STEP F

At this point, if the capacitor chip 38 contains unfilled electrode-cavities 83, they are impregnated with molten solder wettable metal.

STEP G

Solder is evaporated onto the embossed surfaces 66 of FIG. 6.4 either as a blanket coating or as a masked pattern covering the embossed areas.

STEP H

In FIG. 6.5, the soldered capacitor chip 38 formed from laminated capacitor 60 is reflowed so that the metal 67 deposited in step G is caused to form rounded contours 67 on the upper surface of the capacitor 60.

STEP I

In the final step, the capacitor chip 38 is inverted and then is joined to the metallized substrate 70 as can be seen in FIG. 7.1. An advantage of this joint structure is that fatigue resistance is improved by means of an improved solder/ceramic interface which does not lie parallel to the plane 71 along which fatigue cracks (seen in prior art C-4 solder ball joints 72) propagate as shown in FIG. 7.2. This region 71 is observed to contain flattened "pancake"-shaped grains after reflow which are thought to be responsible for the rapid propagation of fatigue cracks through a C-4 solder ball joint. Such a microstructure is not likely to evolve in the solder bar joint 75 of FIG. 7.1 having the recessed (77) ceramic solder interface. The solder bar is anchored in recess 77. Its fatigue fracture path 76 does not lie along the ceramic/solder interface. The solder bar joint, per se, may also have improved fatigue resistance as compared with the C-4 solder ball joint 72, even without the recess provided by embossing.

Post Firing Metal Impregnation

The first step of the post firing metal impregnation process of this invention is to form a green ceramic MLC structure of green ceramic material in which the metal paste is replaced by a mixture of ceramic particles and an organic binder. Then the structure is fired and where the low density particles were located, cavities 83 in FIG. 5 are produced between the dielectric sheets 41 in FIGS. 2.1–2.3 (see FIG. 9). After firing the MLC structure is placed in a vacuum processing chamber; and the chamber is evacuated. Then the MLC structure is dipped into a bath of a liquid metal (e.g., Pb, Sn, Zn, Al and Al-54Mg, solder, Cu, Cu alloys, etc.) and the chamber is pressurized with an inert gas to impregnate the liquid metal into the vias and to fill the cavities 83. The pressure applied is dependent upon the degree of wetting of the ceramic desired. (See the calculations found below.)

An alternative to the use of the above metallic bath is a process in which one employs pieces or balls of solid metal applied to the via openings and, upon heating and pressurization, the liquid melts and is forced into the cavities. Another modification is one in which only a portion of the MLC structure is impregnated with the remainder of the conductive network having been prepared by conventional pasting. This approach might be appropriate for the regions requiring close spacing between vias, for example.

Pressure Required for Liquid Metal Impregnation into Ceramic Cavities Assume as a worst case, no wetting of ceramic by the liquid metal, even though some wetting may occur between the liquids listed below and the ceramic material thereby reducing the pressure required. FIG. 8 shows a fired ceramic 80 material with a cavity 81 into which liquid metal is to be deposited. The cavity 81 has a depth of h.

The pressure is calculated by means of the equation which follows:

$$*P=2gLV/h$$

where gLV is the surface tension of the liquid metal exposed to its vapor and "h" is the cavity height.

TABLE I

| LIQUID METAL | gLV | *P(for h = 5 μm) |
|---|---|---|
| Pb | 470 ergs/cm$^2$ | 27 psi |
| Sn | 550 ergs/cm$^2$ | 32 psi |
| Al | 860 ergs/cm$^2$ | 50 psi |
| Mg | 550 ergs/cm$^2$ | 32 psi |
| Zn | 780 ergs/cm$^2$ | 45 psi |
| Cu | 1300 ergs/cm$^2$ | 75 psi |

*If h is the diameter of a circular via, P = 4gLV/h.

Figure 9:
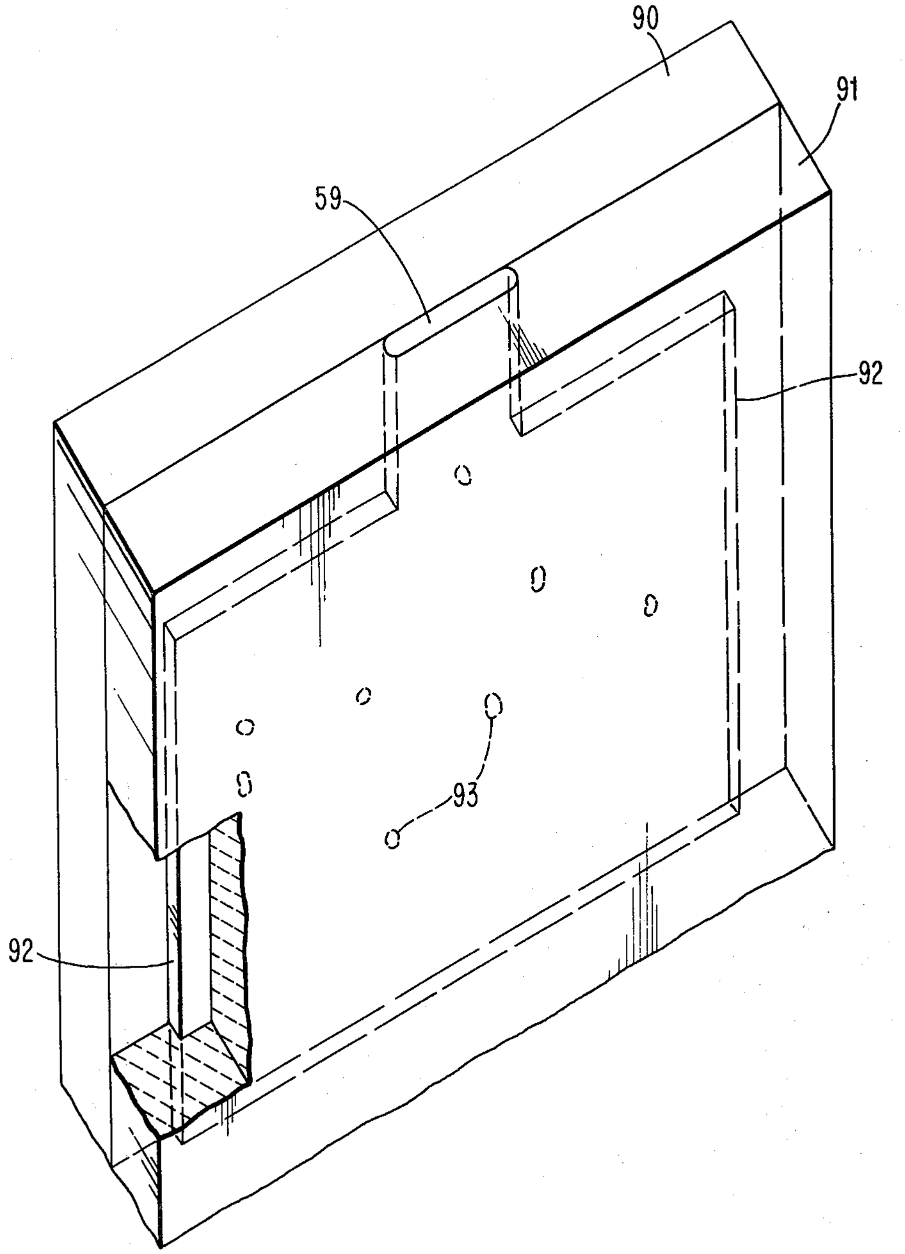
FIG. 9 shows a pair of green sheets with a paste layer (polymeric material containing) between them. After sintering of the ceramic and vaporization and/or combustion of the polymeric material, a cavity is formed in the ceramic into which liquid metal is impregnated.

FIG. 9 shows a set of ceramic sheets 90 and 91 which are stacked in juxtaposition with a film 92 of a metallized ceramic paste with a polymeric material sandwiched between sheets 90 and 91. When the sandwich is fired, the volatile polymeric material escapes leaving the particles of alumina 93, or the like, behind, holding a space open between sheets 90 and 91 into which the liquid metal can be deposited to form the plates and the tab in hole 59.

Having thus described our invention, what we claim as new, and desire to secure by Letters Patent is:

1. In a chip carrier for large scale integrated circuit chips, with a laminated capacitor joined to the surface of said carrier adjacent to positions where chips are located, said laminated capacitor including a plurality of capacitor plates, the improvement comprising bonding said capacitor to said chip carrier with an array of solder bars comprising an elongated strip of metallic material each of said bars connected to a set of said capacitor plates in said laminated capacitor by means of tab connections on said plates, whereby each of said plates is connected by a plurality of tabs to a plurality of said solder bars.

2. An apparatus in accordance with claim 1 wherein said plates and said tabs have been formed by means of introducing metal into said laminated structure.

3. An apparatus in accordance with claim 1 wherein said solder bars have a rounded contour on the surface extending away from said chip.

4. An apparatus in accordance with claim 1 wherein said substrate include a set of elongated pads bonded along their length to said solder bars.

5. A laminated capacitor in accordance with claim 1 wherein said solder bars are formed by embossing of grooves into green ceramic material.

6. A capacitor in accordance with claim 1 wherein at least one of said solder bars is formed in a recess in said laminated capacitor whereby a strong mechanical arrangement is provided.

7. A method of forming a laminated capacitor comprising (a) punching individual layers of green ceramic material having metallic material for forming tabs and/or capacitor plates thereon in selected areas of said layers in a predetermined pattern, (b) stacking said layers of green ceramic material upon one another to form a stack and sintering said green stack, and (c) forming bars on the edge of said stack.

8. The method of claim 7 wherein said bars are formed on the edge of said stack by means of the steps including (a) coating the edge of said sheets with a metal film, with openings being left in said metal film for introduction of liquid metal into openings appropriate for formation of said tabs and/or capacitor plates (b) defining bar patterns on the capacitor by cutting portions of said metal film to form bar portions on said edge coated with said metal film, or forming embossed patterns on said surface prior to firing in step (b), (c) impregnation of molten metal into said tab openings to form tabs and capacitor plates also at will in accordance with predetermined design parameters.

9. A method in accordance with claim 7 wherein said bars are formed on the edge of said stack is performed by applying a mask to said edge of said stack and applying metal to said edge through slots in said mask forming bar patterns.

10. A method in accordance with claim 9 wherein said bars are formed by evaporating metal into said slots.

11. A method in accordance with claim 10 wherein said metal comprises adhesion metal, solder wettable metal and solder evaporated in sequence into said slots.

12. A method in accordance with claim 11 wherein tabs and/or plates in said bars are formed by heating the product of claim 11 in an evacuated chamber above the melting point of said solder, back filling said chamber with an inert gas for forcing solder into said tabs and/or plates in said stack providing impregnation of said metal solder in the liquid state from said slots in said mask onto said edge of said stack and into said tabs and/or plates.

13. A method in accordance with claim 12 wherein said slots and said capacitor plates are prepared for filling wherein said metallization material comprises a premetallization substitute comprising ceramic particles and an organic material, and after firing the structure as above, (a) the structure is placed in a vacuum processing chamber and the chamber is evacuated, (b) the structure is dipped into a liquid metal bath, (c) the chamber is pressurized to drive the liquid metal into the openings in the structure to fill the cavities within said structure to form capacitor plates, vias, and/or tabs.

14. A method in accordance with claim 12 wherein solid metal is applied to said slots and upon heating and pressurization the metal melts and is forced into the cavities which remain thereby forming metallization in said cavities.

15. A method in accordance with claim 12 wherein said solder bar includes enough solder to join said bar to a mounting pad subsequent to said impregnation step.

16. A method for forming a capacitor from a laminated stack of ceramic sheets comprising (a) forming a stack of ceramic green sheets with patterns of metallization or alternatively a screened layer of paste primarily containing combustible/volatile components formed on the surface of said sheets, (b) embossing said stack of green sheets with an array of grooves on the edge of said stack, and (c) firing said stack to produce a partially completed capacitor, (d) coating said embossed edge of said stack with a metal film, (e) machining said edge of said stack to remove the distal portions of said film projecting from said grooves to separate said metal film into segments contained solely within the depressions of said grooves, (f) if the electrode cavities are unfilled with metal at this point because combustible volatile paste was used in step (a), then a step is provided of impregnation of said metal coated grooves with molten solder wettable metal, and (g) evaporation of solder onto said solder wettable metal.

17. A method in accordance with claim 16 wherein the product of claim 16 is reflowed to form rounded contours on said solder bars.

18. A method in accordance with claim 17 wherein the product of claim 17 is inverted and joined to a metallized substrate.

* * * * *